United States Patent [19]
Knepper et al.

[11] 3,938,008
[45] Feb. 10, 1976

[54] COMMON BUS DRIVER COMPLEMENTARY PROTECT CIRCUIT

[75] Inventors: Ronald W. Knepper, La Grangeville; Ralph D. Lane, Wappingers Falls; Peter J. Ludlow, Hopewell Junction; Barry L. Moore, Middletown, all of N.Y.

[73] Assignee: International Business Machines Corporation, Armonk, N.Y.

[22] Filed: Sept. 18, 1974

[21] Appl. No.: 507,111

[52] U.S. Cl. ............. 317/31; 317/33 R; 317/33 SC; 307/202 R
[51] Int. Cl.² ...................... H02H 3/08; H02H 7/20
[58] Field of Search .......... 317/33 R, 33 SC, 36 TD, 317/31, 33 VR; 307/202, 251, 246, 241, 243; 330/207 P

[56] References Cited
UNITED STATES PATENTS

| | | | |
|---|---|---|---|
| 3,555,358 | 1/1971 | Gibbs | 307/202 |
| 3,681,659 | 8/1972 | Suzuki | 317/33 R |
| 3,691,427 | 9/1972 | Honda et al. | 317/33 R |
| 3,814,988 | 6/1974 | Ito | 317/33 R |
| 3,859,560 | 1/1975 | Peters | 307/202 |

OTHER PUBLICATIONS

"Self–limiting Off–chip Driver", by J. C. Elliott and S. D. Malaviya, I.B.M. Tech. Disc., Vol. 16, No. 8, 1/74.

*Primary Examiner*—J. D. Miller
*Assistant Examiner*—Patrick R. Salce
*Attorney, Agent, or Firm*—Sughrue, Rothwell, Mion, Zinn & Macpeak

[57] ABSTRACT

An over current protect circuit for a common bus driver having a complementary pair FET output includes a pair of AND circuits responsive to the gate-source and drain-source voltages for charging separate time integrating capacitors. If a threshold charge is reached a latch is triggered, which in turn disables the driver via a NAND gate and Inverter, and discharges the active capacitor. The latch is reset by dropping the driver enable line. As an alternative, high driver current may be sensed by placing a resistor in series with each output FET and charging the associated capacitor in response to a high current through the resistor.

6 Claims, 4 Drawing Figures

| CONDITION OF OUTPUT | ENABLE | INPUT | A | B | C | D | E | F | G | H | COMMENT |
|---|---|---|---|---|---|---|---|---|---|---|---|
| OPERATIVE | 0 | 0 | 1 | 0 | 0 | 1 | 1 | 0 | 1 | 0 | DISABLED |
| OPERATIVE | 0 | 1 | 1 | 0 | 0 | 1 | 1 | 0 | 1 | 0 | DISABLED |
| OPERATIVE | 1 | 0 | 1 | 1 | 0 | 1 | 1 | 0 | 0 | 1 | NORMAL OP. |
| OPERATIVE | 1 | 1 | 0 | 0 | 0 | 1 | 1 | 0 | 0 | 1 | NORMAL OP. |
| SHORT OCCURS | 0 | 0 | 1 | 0 | 0 | 1 | 1 | 0 | 1 | 0 | DISABLED |
| SHORT OCCURS | 0 | 1 | 1 | 0 | 0 | 1 | 1 | 0 | 1 | 0 | DISABLED |
| SHORT OCCURS TO $V_H$ | 1 | 0 | 1 | 1→0 | 0 | 1↘0 | 1→0 | 0→1 | 0→1 | 1→0 | CIRCUIT DISABLED |
| SHORT OCCURS TO GND | 1 | 1 | 0→1 | 0 | 0↗1 | 1 | 1→0 | 0→1 | 0→1 | 1→0 | CIRCUIT DISABLED |

COMMON BUS DRIVER COMPLEMENTARY PROTECT CIRCUIT

BACKGROUND OF THE INVENTION

1. Field of the Invention

This invention relates to a protection circuit for disabling a bus driver circuit upon the detection of a destructively high current in its output for a predetermined time.

2. Description of the Problem to be Solved

In certain circuit designs a plurality of driver outputs are directly coupled to a common bus, which may be a data bus, an address line, or the like. The output stage of each driver may comprise a complementary pair of field effect transistors, and the many drivers are synchronously controlled such that only one driver is operatively enabled at a given time. The separate drivers may be physically located on a number of different chips. The general arrangement may easily be understood from the simplified circuit diagram shown in FIG. 1.

In the event of a malfunction in the control circuitry whereby two or more of the driver Enable lines are simultaneously raised, a situation could easily obtain where one driver is pulling up while another driver is pulling down. In other words, the upper or positive FET in Driver 1 could be conducting at the same time as the lower or negative FET in Driver 2. This would not only render the output indeterminate since the bus loading capacity would be neither charged nor discharged, but would create a direct, d.c. short from the source voltage to ground through the two conducting FET's and the common bus. The attendant high current could easily destroy the driver chips, and would certainly impact the reliability of the metal powering lines on these chips.

To combat this potential problem at the system level by providing circuitry to ensure that only one driver is enabled at a given time is both difficult and impractical, particularly in view of the requirements that would be imposed on such circuitry during start-up and testing.

SUMMARY OF THE INVENTION

Since it is mandatory to prevent driver chip destruction every time a multi-enable occurs, the present invention approaches the problem by accepting the latter condition and providing a protect circuit for the individual driver. Preferably, one protect circuit is provided for each individual driver. The protect circuit functions as a current sensing-time integrator, and disables its associated driver whenever its output appears as a d.c. short.

Specifically, means are provided for sensing an undesirably high current in the source-drain path on each of the two complementary driver output FET's. A time integrating capacitor is charged in response to the sensing of such over current, and if the capacitor reaches a predetermined threshold level a latch is triggered, which in turn disables the driver via a NAND gate and an inverter.

The current sensing may be done by ANDing the gate-source and drain-source voltages of each output FET, or by inserting a resistor in series with the source of each output FET and sensing the current through the resistor.

DESCRIPTION OF THE PREFERRED EMBODIMENTS

Figure 1:
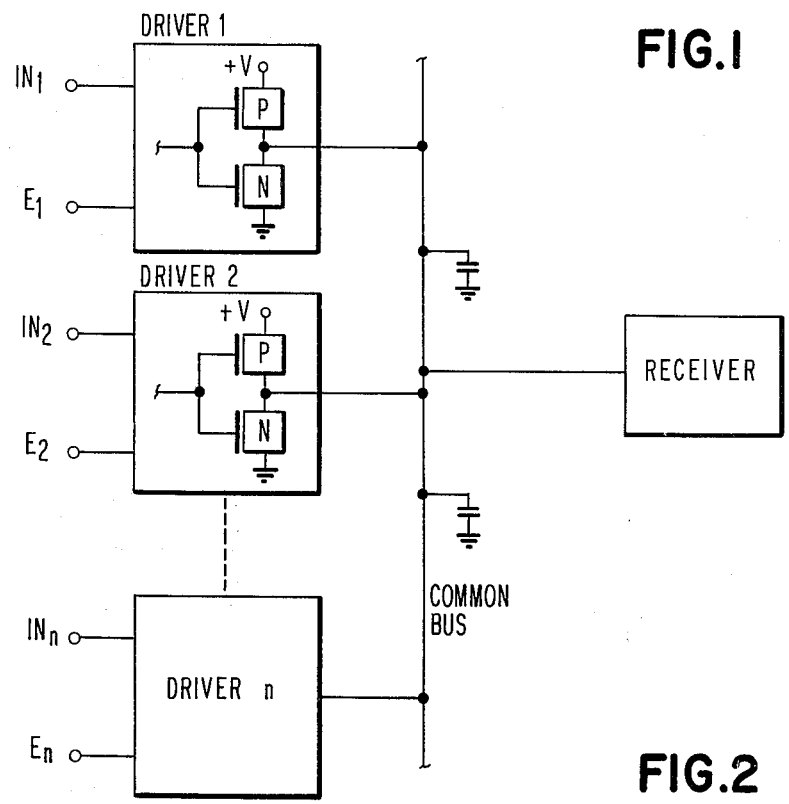
FIG. 1, which has already been referred to, shows a simplified circuit diagram of a common bus driver arrangement without any protect circuitry.
Figure 2:
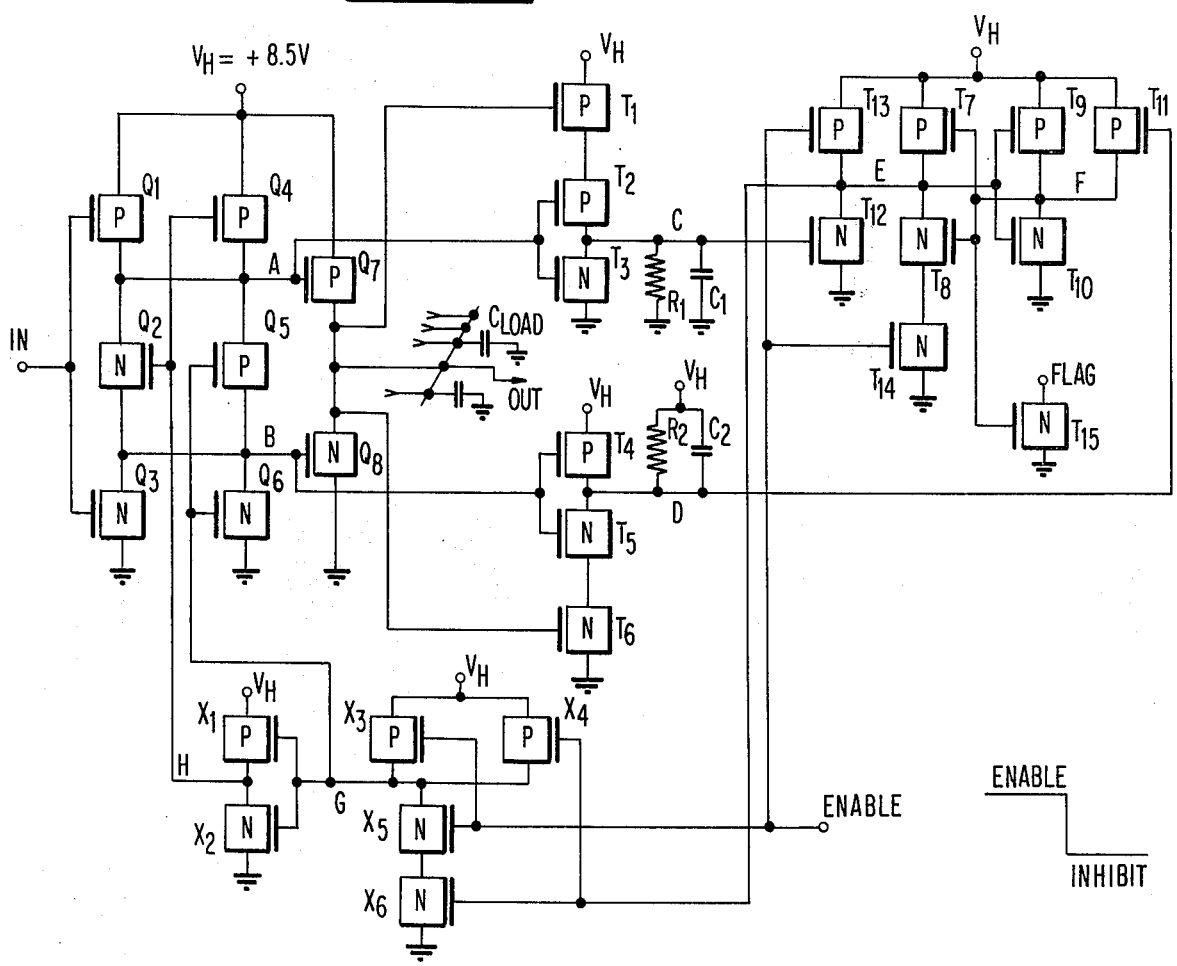
FIG. 2 shows a schematic diagram of a protect circuit constructed in accordance with the teaching of this invention and coupled to a complementary output FET driver.

Referring to FIG. 2, a driver circuit comprises (field effect) transistors Q1–Q8 having the polarities indicated and connected as shown. The driver output, taken from the drain terminal junction of Q7 and Q8, is coupled to a capacitively loaded common bus, in the same manner as shown in FIG. 1.

A high output current through Q7 is sensed by ANDing its gate-source and drain-source voltages with transistors T1–T3, whose output feeds a charging capacitor C1. The latter is also coupled to the gate terminal of transistor T12, which serves to trigger a latch comprising transistors T7–T10 whenever the capacitor charge exceeds a predetermined threshold level. The latch output, which appears at node E, is applied to a two-way NAND circuit comprising transistors X3–X6, and the direct output of the latter, together with an inverted output effected by transistors X1 and X2, is fed to the driver transistors Q5, Q6 and Q2, Q4, respectively. In a similar manner, high output current through Q8 is sensed by an AND circuit comprising transistors T4–T6, whose output supplies charging capacitor C2. If such a high current persists for a sufficiently long time, typically about $1 \mu s$, the time integrated charge on C2 becomes large enough in magnitude to turn on transistor T11, which in turn triggers the latch.

Transistor T3 serves to reset capacitor C1 to zero voltage if node A switches high, which occurs whenever the driver is disabled or whenever the driver Input is low. A similar reset function is performed by transistor T4 with respect to capacitor C2. Resistors R1 and R2 are provided in the circuit to prevent false triggering of the latch due to parasitic leakage currents from the $V_H$ supply to node C or from node D to ground. Stated another way, these resistors simply prevent their associated nodes from floating.

In normal operation, of course, the protect circuit never comes into play. With the Enable line high, node G is low, node H is high, and transistors Q2 and Q5 are both on, (Q4 and Q6 are off) thus readying the driver for operation. If the driver input is high, for example, Q1 switches off and Q3 switches on. This drops nodes A and B to ground, which turns Q7 on and Q8 off. During the initial time that Q7 conducts to charge the capacitive common bus load its drain potential is relatively low, and T1 and T2 may both turn on. Before the charge on capacitor C1 can reach the design threshold or triggering level, however, the load capacitance becomes charged and the drain potential of Q7 rises to cutoff T1, thus terminating the charging of C1. During the next input transition or Enable down condition, node A goes high which turns on T3 to drain C1 of any accumulated charge.

If a malfunction or short occurs, however, as when Q7 conducts simultaneously with Q8 of another driver, T1 remains hard on sufficiently long for the charge on C1 to reach the conduction threshold of T12. When the latter conducts, Node E goes to ground, and is clamped there by the triggered latch, X6 is cutoff, and X4 becomes conductive. This raises node G, which cuts off X1 and turns on X2 to drop node H to ground, which in turn cuts off Q2 and Q5 and turns on Q4 and Q6 to disable the driver and break the short circuit.

The latch is reset to node E high and node F low when the Enable line drops down to the Inhibit level. When the latch is triggered the Flag terminal also drops to ground through transistor T15. The latter may have its drain terminal tied to all of the other Flag terminals on a given chip to serve as an indicator whenever a multi-Enable or short condition occurs, and it may also be useful for diagnostic purposes.

Figures 3, 4:
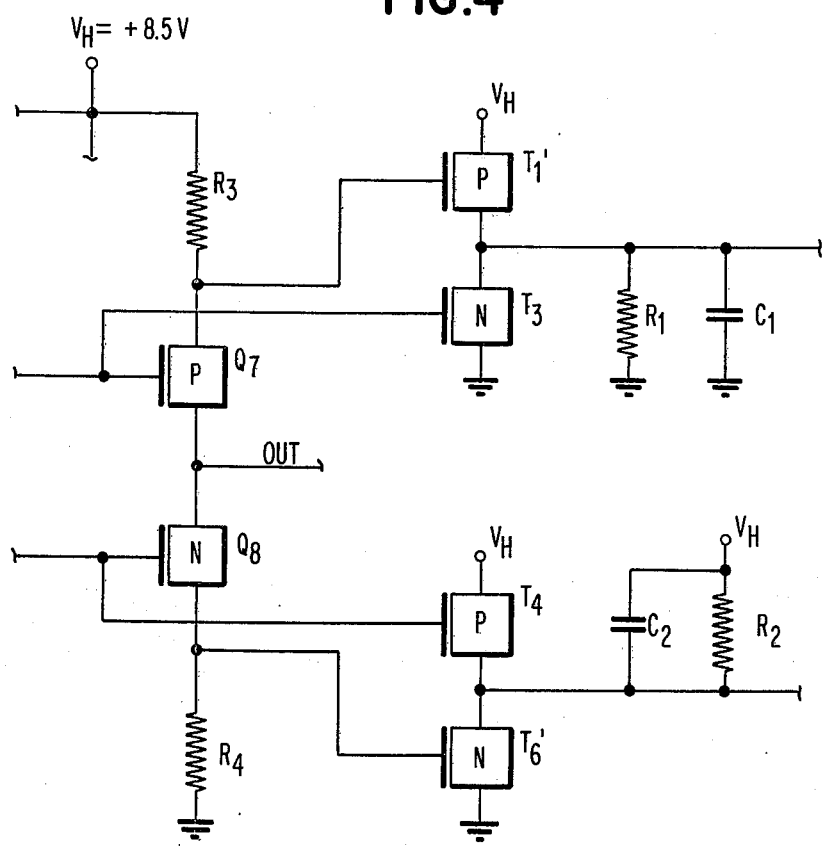
FIG. 3 shows a truth table for the circuit of FIG. 2.
FIG. 4 shows a partial schematic diagram illustrating an alternate current sensing arrangement.

A complete truth table for the circuit of FIG. 2 is presented in FIG. 3, from which the operation of the protect circuit can easily be determined for various combinations of the Input, Output, and Enable signals. Basically, if the Enable line is low the entire circuit is disabled regardless of whether or not an output short exists. When the Enable line is high the protect circuit is operative, protecting Q7 against a short to ground when the Input is high, and protecting Q8 against a short to $V_H$ when the Input is low. Both Q7 and Q8 must be protected since a situation might occur, as may be visualized from FIG. 1, where a number of drivers become enabled simultaneously. If only one driver is pulling up (Q7 on) while the rest are pulling down (Q8 on), the d.c. voltage on the bus could drop very close to ground potential. Under these circumstances there would be insufficient current in any one of the down pulling drivers to trigger its protect circuit. The single up pulling driver would exhibit a very large output current, however, and would be quickly disabled by its protect circuit to thereby open the short circuit path.

Referring now to the alternate embodiment shown in the partial schematic diagram of FIG. 4, resistors R3 and R4 are connected in series in the power supply to source terminal and source terminal to ground paths of Q7 and Q8, respectively. Rather than employing AND gates to sense output over currents, the same function is now performed by sensing the voltage drop across the resistors, which is, of course, a function of the current flowing through the output transistors. Specifically, when the output current through Q7 reaches a predetermined level the potential at the source terminal side of R3 drops sufficiently low to turn on transistor T1' and initiate the charging of capacitor C1. The same analysis holds true with respect to Q8, R4, T6', and C2, except that in this instance, owing to the reversed polarities, T6' is gated on when the potential at the source terminal side of R4 rises sufficiently high. The structure and operation of the circuits of FIG. 2 and FIG. 4 are identical in all other respects.

This alternative embodiment may be attractive for situations where resistors R3 and R4 are inherently present in the circuit as parasitics or where their inclusion is easy to implement. This alternate approach may be less desirable for very high speed drivers where R3 and R4 might appreciably degrade the circuit performance, in which case the previously described embodiment would be favored.

While this invention has been particularly described with reference to the preferred embodiments thereof, it will be understood by those skilled in the art that the foregoing and other changes in form and details may be made therein without departing from the spirit and scope of the invention.

What is claimed is:

1. An over current protection circuit for at least one of a plurality of drivers whose outputs are coupled to a common bus load, each driver including an output stage comprising at least one active element having at least three terminals, comprising:
   a. means for sensing an output current from the driver above a predetermined level and for producing an output signal during the time that the driver output current exceeds the predetermined level, said sensing means comprising and AND gate responsive to the potentials across at least two pairs of the three terminals of the active element,
   b. capacitor means coupled to the sensing means output for accumulating and storing a charge proportional to the time integral of the output signal,
   c. a bistable latch coupled to the capacitor means and adapted to be triggered thereby in response to the accumulated charge reaching a predetermined level, and
   d. gate means coupled between the latch and the driver for disabling the driver in response to the triggering of the latch.

2. An over current protection circuit as defined in claim 1 wherein:
   a. the driver comprises an output stage including a pair of complementary field effect transistors, and
   b. the sensing means comprises a pair of AND gates individually responsive to the gate-source and drain-source potentials of the transistors.

3. An over current protection circuit as defined in claim 1 further comprising signal input means coupled to the gate means and to the latch for selectively enabling or inhibiting the driver and for resetting the latch after triggering.

4. An over current protection circuit as defined in claim 3 wherein the gate means comprises a two-way NAND circuit.

5. An over current protection circuit as defined in claim 1 further comprising switch means for discharging the capacitor means whenever the transistor is cut off.

6. A number of over current protection circuits as defined in claim 1 wherein said number is equal to the number of said drivers.

* * * * *